United States Patent
Sakai et al.

(10) Patent No.: US 9,503,016 B2
(45) Date of Patent: Nov. 22, 2016

(54) SOLAR PANEL UNIT

(71) Applicant: DAIKIN INDUSTRIES, LTD., Osaka-shi, Osaka (JP)

(72) Inventors: Toshiyuki Sakai, Osaka (JP); Tetsuya Matsuura, Osaka (JP); Yoshitaka Yasui, Osaka (JP)

(73) Assignee: Daikan Industries, Ltd., Osaka (JP)

( * ) Notice: Subject to any disclaimer, the term of this patent is extended or adjusted under 35 U.S.C. 154(b) by 0 days.

(21) Appl. No.: 14/431,910

(22) PCT Filed: Sep. 30, 2013

(86) PCT No.: PCT/JP2013/005826
§ 371 (c)(1),
(2) Date: Mar. 27, 2015

(87) PCT Pub. No.: WO2014/050153
PCT Pub. Date: Apr. 3, 2014

(65) Prior Publication Data
US 2015/0244309 A1 Aug. 27, 2015

(30) Foreign Application Priority Data
Sep. 28, 2012 (JP) ................................ 2012-217908

(51) Int. Cl.
*F24J 2/38* (2014.01)
*H02S 20/10* (2014.01)
(Continued)

(52) U.S. Cl.
CPC .................. *H02S 20/32* (2014.12); *F24J 2/38* (2013.01); *F24J 2/405* (2013.01); *F24J 2/5413* (2013.01);
(Continued)

(58) Field of Classification Search
CPC .................. F24J 2/38; F24J 2/40; F24J 2/405
USPC .................... 250/203.1, 203.4; 126/600, 601; 136/244, 248
See application file for complete search history.

(56) References Cited

U.S. PATENT DOCUMENTS

2010/0296949 A1* 11/2010 Corley .................. F04B 9/1095
417/279
2012/0227729 A1 9/2012 Lundahl
(Continued)

FOREIGN PATENT DOCUMENTS

JP 2003-324210 A 11/2003
JP 2010-67716 A 3/2010
(Continued)

OTHER PUBLICATIONS

International Search Report, issued in PCT/JP2013/005826, dated Oct. 22, 2013.
(Continued)

*Primary Examiner* — Kevin Pyo
(74) *Attorney, Agent, or Firm* — Birch, Stewart, Kolasch & Birch, LLP (57) ABSTRACT

A solar panel unit (10) includes a control unit (73) which operates an actuator (41) such that an angle of a solar panel (20) coincides with a predetermined command angle. The control unit (73) performs reset control for resetting the angle of the solar panel (20) misaligned due to strong wind. In the reset control, the actuator (41) is not operated until a predetermined time has passed since the angle of the solar panel (20) was misaligned to wait for the strong wind to stop, and then the actuator (41) is operated to reset the angle of the solar panel (20).

4 Claims, 7 Drawing Sheets

(51) Int. Cl.
*F24J 2/40* (2006.01)
*F24J 2/54* (2006.01)
*H01L 31/042* (2014.01)
*G01S 3/786* (2006.01)

(52) U.S. Cl.
CPC ............ *H01L 31/042* (2013.01); *H02S 20/10* (2014.12); *F24J 2002/5441* (2013.01); *F24J 2002/5451* (2013.01); *F24J 2002/5468* (2013.01); *G01S 3/7861* (2013.01); *Y02E 10/47* (2013.01)

(56) References Cited

U.S. PATENT DOCUMENTS

2012/0279487 A1* 11/2012 Pineau .................. F24J 2/38
126/604

2013/0247962 A1    9/2013  Sakai et al.
2015/0236637 A1*   8/2015  Sade .................. H02S 20/10
136/246

FOREIGN PATENT DOCUMENTS

| | | |
|---|---|---|
| JP | 3172406 U | 12/2011 |
| JP | 2012-54381 A | 3/2012 |
| JP | 2012-117273 A | 6/2012 |
| KR | 101034478 B1 * | 5/2011 |

OTHER PUBLICATIONS

Written Opinion of the International Searching Authority, issued in PCT/JP2013/005826, dated Oct. 22, 2013.

* cited by examiner

TILTED TO FACE THE EAST
(TILT ANGLE INCREASES)

FIG.4B

POSITION AT TARGET ANGLE

FIG.4C

TILTED TO FACE THE WEST
(TILT ANGLE DECREASES)

SOLAR PANEL UNIT

TECHNICAL FIELD

The present disclosure relates to a solar-tracking solar panel unit, particularly to measures to reduce power consumption of the solar panel unit.

BACKGROUND ART

Solar-tracking solar panel units have been known. For example, Patent Document discloses a solar panel unit including solar panels, and a driver having an electric motor. The solar panels of the solar panel unit rotate to receive the sunlight incident at a right angle on the solar panels. This can increase the sunlight received by the solar panels, and can increase power generated by the solar panels.

CITATION LIST

Patent Document

[Patent Document 1] Japanese Unexamined Patent Publication No. 2003-324210

SUMMARY OF THE INVENTION

Technical Problem

In the known solar-tracking solar panel unit, an angle of the solar panel may be misaligned from an intended angle when a large external force is exerted on the solar panel, e.g., by strong wind. Thus, when the angle of the solar panel is misaligned, the electric motor is immediately driven to reset the angle of the solar panel.

In the known control, however, power is constantly supplied to the electric motor to operate the electric motor while the strong wind is blowing. This increases power consumption.

In view of the foregoing, the present disclosure has been achieved to reduce the power required for controlling the solar panels of the solar panel unit.

Solution to the Problem

A first aspect of the present disclosure relates to a solar panel unit including: a rotatably supported solar panel (20); an actuator (41) which is connected to the solar panel (20) to rotate the solar panel (20); an angle detector (60) which detects an angle of the solar panel (20); and a control unit (73) which operates the actuator (41) such that the angle of the solar panel (20) detected by the angle detector (60) coincides with a command angle. The command angle is an angle of the solar panel (20) determined in accordance with a direction of the sun. The solar panel unit further includes a command angle setting unit (72) which sets the command angle every first predetermined time. The control unit (73) performs tracking control by operating the actuator (41) such that the detected angle coincides with the command angle every time the command angle setting unit (72) sets the command angle, and performs reset control by starting operation of the actuator (41) after second predetermined time has passed since the detected angle was misaligned from the command angle in a period between the tracking controls to reset the angle of the solar panel (20).

According to the first aspect of the present disclosure, the reset control is performed when the angle of the solar panel (20) is misaligned from the command angle due to strong wind. In the reset control, the operation of the actuator (41) is started after the predetermined time (the second predetermined time) has passed since the angle of the solar panel (20) was misaligned. Thus, when time until the strong wind stops is set as the predetermined time (the second predetermined time), the operation of the actuator (41) can be started to reset the angle of the solar panel (20) after the strong wind has stopped. As a result, the actuator (41) is not wastefully operated while the strong wind is blowing, and operating time of the actuator (41) can be reduced.

In a second aspect of the present disclosure related to the first aspect, the actuator (41) rotates the solar panel (20) by air pressure.

According to the second aspect of the present disclosure, when the solar panel (20) rotates due to the strong wind, the pneumatic actuator (41) shrinks (or expands). The air pressure in the actuator (41) increases when the actuator (41) shrinks, while the air pressure in the actuator (41) decreases when the actuator (41) expands. Thus, the actuator (41) generates a restoring force in a direction of resetting the angle of the solar panel (20).

According to the second aspect of the present disclosure, when the angle of the solar panel (20) misaligned from the command angle due to the strong wind is reset by the restoring force of the pneumatic actuator (41) until the predetermined time (the second predetermined time) has passed since the angle of the solar panel (20) was misaligned from the command angle. Thereafter, the operation of the actuator (41) is started to continue the resetting of the angle of the solar panel. Thus, the operating time of the actuator (41) can further be reduced.

In a third aspect of the present disclosure related to the second aspect, the solar panel unit further includes: an air pressure supplier (42) which supplies the air pressure to the actuator (41); and a supply passage (44) connecting the air pressure supplier (42) and the actuator (41), wherein a relief valve (43) is provided in the supply passage (44) to discharge air outside.

According to the third aspect of the present disclosure, when the solar panel (20) rotates in the direction of shrinkage of the actuator (41) due to the strong wind, the air in the actuator (41) may be compressed to abnormally increase the air pressure. However, according to the third aspect of the present disclosure, the air is discharged outside through the relief valve (43) provided between the air pressure supplier (42) and the actuator (41). This can reduce the abnormal increase in air pressure in the actuator (41).

Advantages of the Invention

According to the first aspect of the present disclosure, the reset control is performed to reset the angle of the solar panel (20) misaligned due to the strong wind. In the reset control, the actuator (41) is not operated until the predetermined time (the second predetermined time) has passed since the angle of the solar panel (20) was misaligned to wait for the strong wind to stop, and then the actuator (41) is operated after the lapse of the predetermined time (the second predetermined time) to reset the angle of the solar panel (20). In this way, the actuator (41) is not wastefully operated while the strong wind is blowing, and the operating time of the actuator (41) can be reduced as compared with the conventional case where the electric motor is constantly operated while the strong wind is blowing. This can reduce the power consumption.

According to the second aspect of the present disclosure, the pneumatic actuator is used as the actuator (41). Thus, the restoring force of the actuator (41) can reset the angle of the solar panel (20) until the predetermined time (the second predetermined time) has passed since the angle of the solar panel (20) was misaligned due to the strong wind. When the angle of the solar panel (20) is not completely reset in the predetermined time (the second predetermined time), the operation of the actuator (41) is started to continue the resetting of the angle of the solar panel. This can further reduce the operating time of the actuator (41), and can further reduce the power consumption.

According to the third aspect of the present disclosure, the relief valve (43) is provided in the supply passage (44) between the air pressure supplier (42) and the actuator (41). This can reduce the abnormal increase in air pressure in the actuator (41), and can prevent break of the actuator (41) and the air pressure supplier (42) due to the air pressure that has exceeded withstand pressures of the actuator (41) and the air pressure supplier (42).

DESCRIPTION OF EMBODIMENTS

Embodiments of the present disclosure will be described in detail below with reference to the drawings. The following embodiments are provided merely for the illustration purpose, and do not limit the present disclosure, applications, or uses thereof.

First Embodiment

Figure 1:
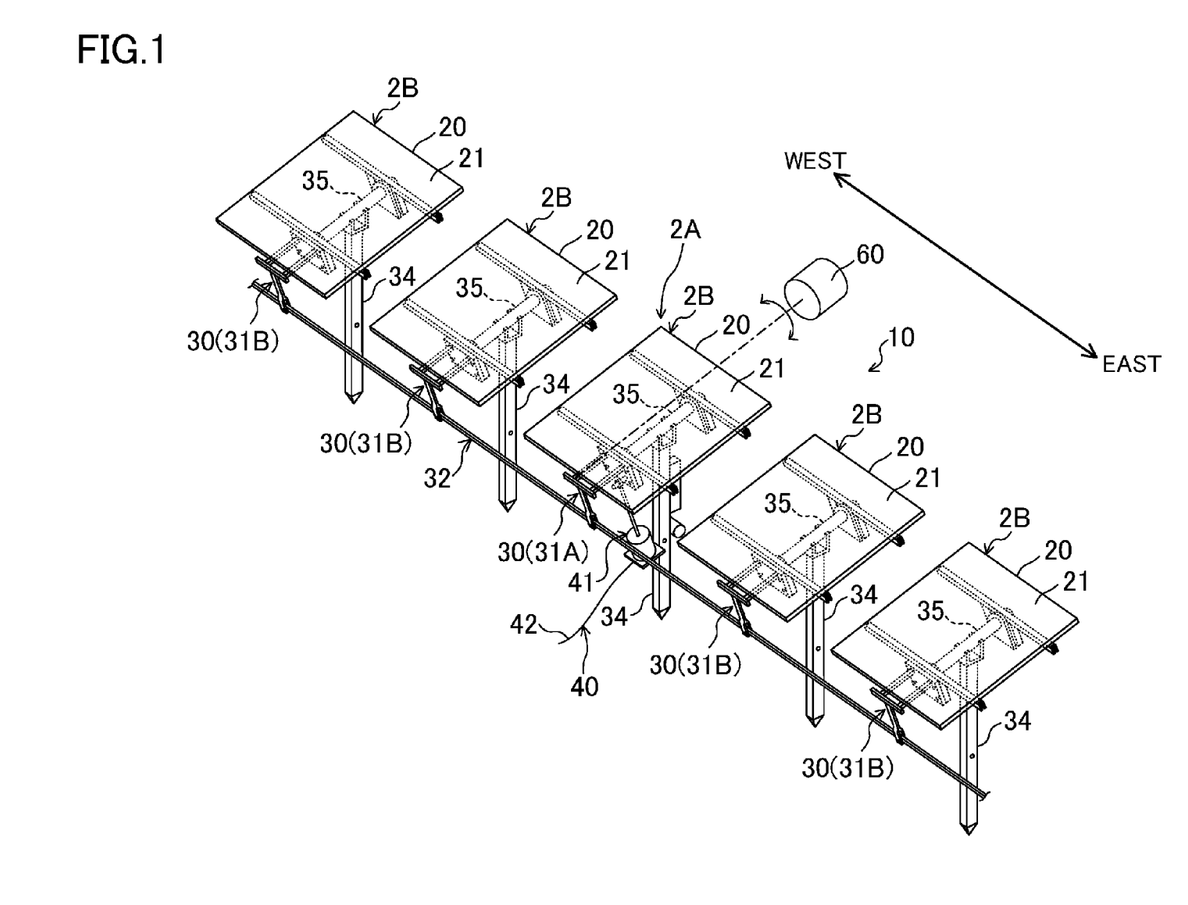
FIG. 1 is a perspective view showing a general configuration of a solar panel unit of an embodiment.
Figure 2:
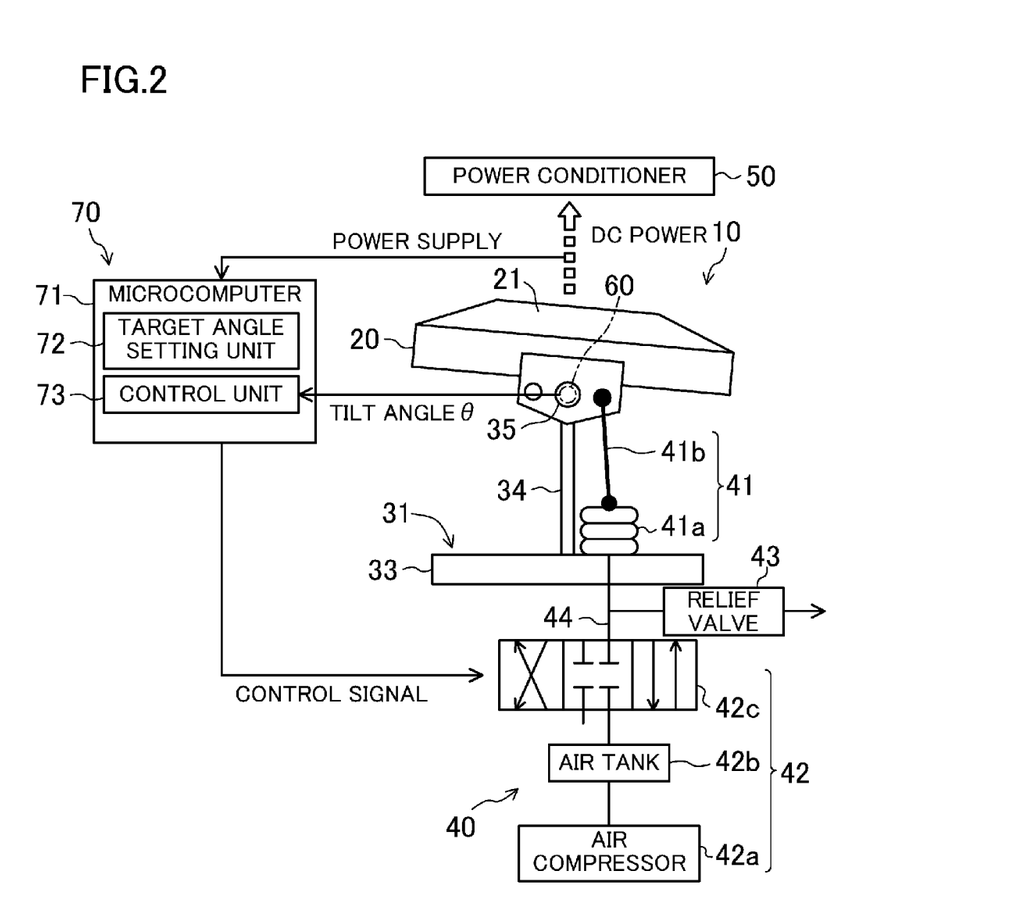
FIG. 2 is a general configuration diagram showing a driving cradle, a solar panel, an actuator unit, etc. of the embodiment.

As shown in FIG. 1 and FIG. 2, a solar panel unit (10) of the present embodiment includes a plurality of solar panels (20) which are configured to follow the movement of the sun.

The solar panel unit (10) includes a light tracking panel group (2A) including the plurality of solar panels (20), a support mechanism (30) supporting the light tracking panel group (2A), and an actuator unit (40) for tilting the light tracking panel group (2A).

The light tracking panel group (2A) includes a plurality of module units (2B) to which the solar panels (20) are fixed, respectively. For example, five module units (2B) are arranged in parallel. The five module units (2B) are arranged in an east-west direction.

The solar panels (20) are attached to the module units (2B), respectively. Each of the solar panels (20) is flat, and has a top surface serving as a light receiving surface (21).

The supporting mechanism (30) includes cradles (31) on which the module units (2B) are disposed, respectively, and a link (32) connecting the module units (2B).

The cradles (31) support the solar panels (20) such that the solar panels (20) face the north and tilt upward. Among the five cradles (31), the center cradle (31) is a driving cradle (31A) for rotating the module unit (2B) in the east-west direction, and the two cradles (31) on the right and the left of the center cradle are driven cradles (31B) supporting the module units (2B) which rotate as the module unit (2B) on the driving cradle (31A) rotates.

Each of the cradles (31) includes a base (33) (see FIG. 2), a stay (34) connecting the module unit (2B) to the base (33), and a rotation axis (35) connected to the stay (34) and attached to the module unit (2B). The rotation axis (35) extends in a north-south direction, i.e., a longitudinal direction of the module unit (2B), and is attached to the module unit (2B) to rotate the module unit (2B) in the east-west direction, i.e., in a left-right direction. The rotation axis (35) is located at the center of the solar panel (20) in the left-right direction (the east-west direction).

The link (32) is pin-connected to an end of each of the five module units (2B), and is configured to rotate the module units (2B) on the driven cradles (31B) along with the rotation of the module unit (2B) on the driving cradle (31A).

The actuator unit (40) includes an actuator (41), an air pressure supplier (42), and a relief valve (43).

The actuator (41) is connected to the solar panel (20) to rotate the solar panel (20). The actuator (41) is a pneumatic actuator which shrinks and expands by air pressure, and includes an air bag (41a), and a rod (41b).

The air bag (41a) can shrink and expand in the vertical direction, and is disposed on the driving cradle (31A). A lower end of the air bag (41a) is connected to an air valve (42c) of the air pressure supplier (42) through a supply passage (44).

The rod (41b) is a vertically extending rod, and has an upper end connected to the solar panel (20), and a lower end connected to an upper end of the air bag (41a).

The actuator (41) is configured to supply the air from the air pressure supplier (42) to the air bag (41a) to exert the air pressure on the air bag (41a) such that the air bag (41a) expands upward, and the rod (41b) presses the solar panel (20) upward. The actuator (41) is also configured to feed the air from the air bag (41a) to the air pressure supplier (42) to remove the air pressure such that the air bag (41a) shrinks due to the weight of the solar panel (20).

The air pressure supplier (42) supplies the air pressure to the actuator (41), or emits the air from the actuator (41) to operate (shrink and expand) the actuator (41), and includes an air compressor (42a), an air tank (42b), and an air valve (42c).

The air compressor (42a) discharges the air at a predetermined pressure (compressed air).

The air tank (42b) is connected to the air compressor (42a), and stores the compressed air discharged from the air compressor (42a).

The air valve (42c) is connected to the air tank (42b). The air valve (42c) is a three-way switching valve, and performs switching between a state where the air is supplied from the air tank (42b) to the air bag (41a), and a state where the air is discharged from the air bag (41a) to the outside. The air valve (42c) is connected to a microcomputer (71) through a signal line. The microcomputer (71) controls the air valve (42c) to open/close.

The relief valve (43) is provided in the supply passage (44). The relief valve (43) is configured to prevent abnormal increase in air pressure in the air bag (41a) when the air valve (42c) is closed such that the air bag (41a) does not communicate with the air tank (42b) and the outside. In the solar panel unit (10) of the present embodiment, the air in the air bag (41a) is compressed to increase the air pressure in the air bag (41a) when the solar panel (20) rotates in the direction in which the air bag (41a) shrinks due to an external force, e.g., strong wind. However, when the air pressure reaches a set pressure of the relief valve (43), the air is discharged outside through the relief valve (43), thereby avoiding the abnormal increase in air pressure.

The solar panel unit (10) further includes a power conditioner (50), an angle sensor (60), and a controller (70).

The power conditioner (50) is a power converter for converting DC power output from the solar panel (20) to AC power. The AC power output from the power conditioner (50) is supplied to a predetermined load (not shown).

The angle sensor (60) detects an angle (a tilt angle) of the solar panel (20), and is an angle detector of the present disclosure. The angle sensor (60) is attached to the rotation axis (35) of the driving cradle (31A). The angle sensor (60) of the present embodiment is an angular potentiometer which outputs a voltage variable in accordance with the angle of the solar panel (20). A detection signal of the angle sensor (60) is appropriately input to the microcomputer (71) to be calculated and stored as a detected angle.

Part of the DC power output from the solar panel (20) is supplied to the controller (70). The controller (70) includes the microcomputer (71) including a command angle setting unit (72), and a control unit (73).

The command angle setting unit (72) sets a command angle of the solar panel (20) every predetermined time (every first predetermined time of the present disclosure). The command angle is an angle of the solar panel (20) determined in accordance with the direction of the sun, and is varied to maximize the power generated by the solar panel (20), for example. Specifically, the command angle is set such that the light receiving surface (21) of the solar panel (20) faces the east in the morning, the light receiving surface (21) of the solar panel (20) faces almost immediately above in the afternoon, and the light receiving surface (21) of the solar panel (20) faces the west in the evening. In the present embodiment, the command angle is set every minute in a period from the morning to the evening. The duration of the predetermined time (the first predetermined time) is merely an example, and is not limited thereto.

The control unit (73) operates the actuator (41) to control the angle of the solar panel (20). Specifically, the control unit (73) controls the operation of the actuator (41) such that the angle of the solar panel (20) detected by the angle sensor (60) coincides with the command angle set by the command angle setting unit (72). The control unit (73) performs tracking control and reset control.

In the tracking control, the solar panel (20) is controlled to follow the movement of the sun in accordance with the movement of the sun. The tracking control is performed every time the command angle setting unit (72) sets a new command angle (every minute), and the control unit (73) controls the operation of the actuator (41) such that the angle (the detected angle) of the solar panel (20) coincides with the new command angle.

The reset control is performed to reset the angle of the solar panel (20) misaligned due to the external force exerted on the solar panel (20), such as the strong wind. The reset control is performed when the angle (the detected angle) of the solar panel (20) is misaligned from the command angle in a period between the tracking controls. The control unit (73) starts the operation of the actuator (41) after the predetermined time (second predetermined time of the present disclosure) has passed since the angle (the detected angle) of the solar panel (20) was misaligned from the command angle. In the present embodiment, the predetermined time (the second predetermined time) is 5 seconds. The duration of the predetermined time (the second predetermined time) is merely an example, and the duration is not limited thereto.

Operation Mechanism

An operation mechanism of the solar panel unit (10) will be described below.

When the light receiving surface (21) of the solar panel (20) receives the sunlight in the morning, the DC power is generated by the solar panel (20). Part of the DC power is supplied to the controller (70) to turn the solar panel unit (10) on.

When the solar panel unit (10) is turned on, the control unit (73) controls the solar panel (20). The control unit (73) performs the tracking control and the reset control in accordance with a control flow shown in FIG. 3.

(Tracking Control)

The tracking control will be described below.

Figure 3:
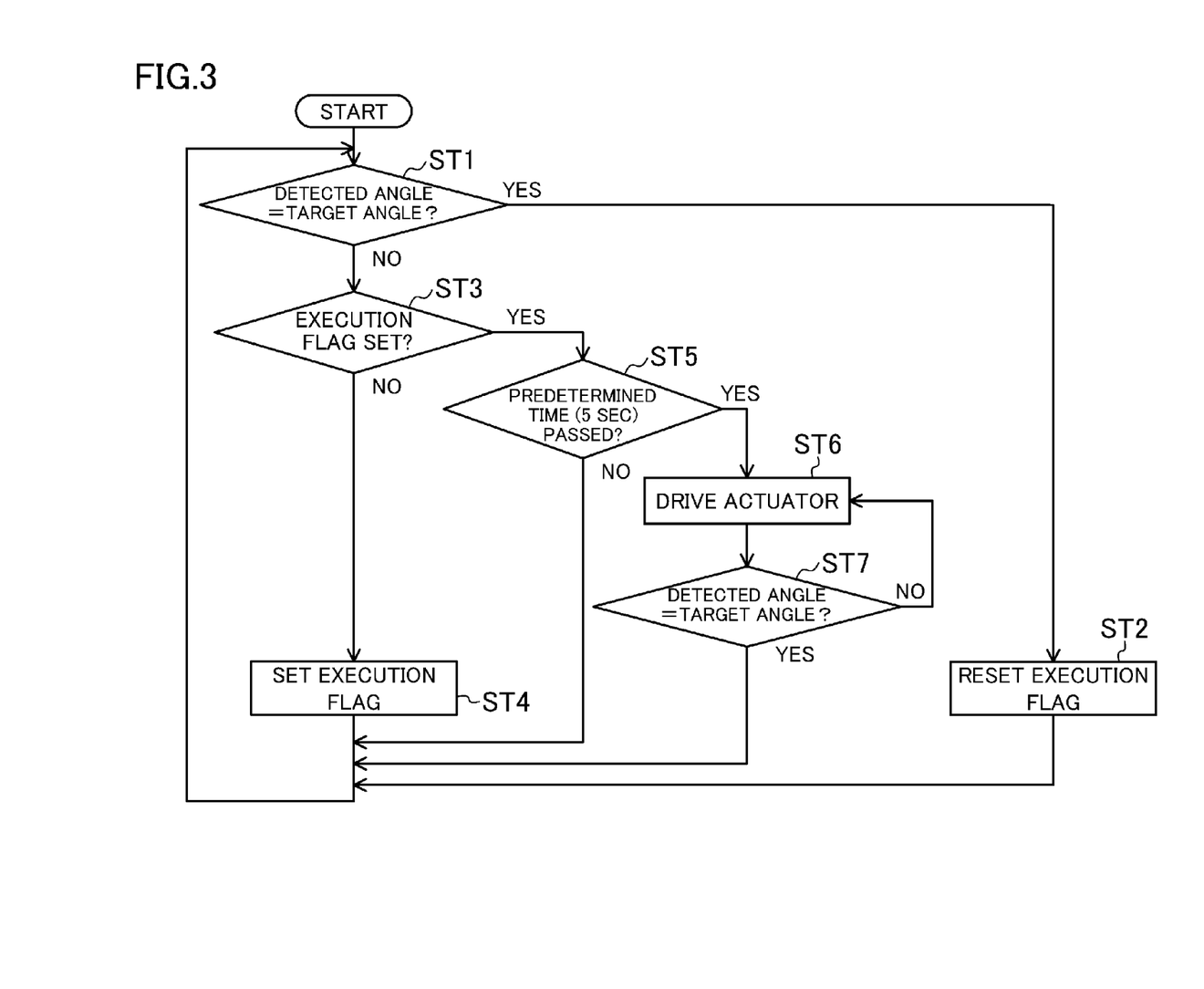
FIG. 3 is a flowchart showing a control flow of a control unit of the embodiment.

The control unit (73) determines whether the solar panel (20) is at a desired angle or not in step ST1. Specifically, the control unit (73) determines whether the detected angle detected by the angle sensor (60) is equal to the command angle set by the command angle setting unit (72) or not.

In step ST1, it is determined that the detected angle is equal to the command angle when a new command angle is not set by the command angle setting unit (72), and the flow proceeds to step ST2. While an execution flag is not set, the flow returns to step ST1, and steps ST1 and ST2 are repeated. Then, when the command angle setting unit (72) sets a new command angle, it is determined that the detected angle is different from the command angle, and the flow proceeds to step ST3.

In step ST3, whether the execution flag is set or not is determined. The execution flag is set when the detected angle is determined to be different from the command angle in step ST1. Specifically, the execution flag is not yet set immediately after the detected angle is determined to be different from the command angle in step ST1 (in a first loop). Thus, the flow proceeds to step ST4 to set the execution flag. Thereafter (in a second loop and subsequent loops), the flow proceeds to step ST5 because the execution flag has been set.

In step ST5, it is determined whether the predetermined time or more (5 seconds or more in this example) has passed since the detected angle was determined to be different from the command angle. When the time passed does not exceed the predetermined time (not more than 5 seconds), the flow repeats steps ST1, ST3, and ST5 in this order. When the time passed is the predetermined time (5 seconds), the flow proceeds to step ST6.

In step ST6, the air pressure supplier (42) is operated to operate the actuator (41). Specifically, when the microcomputer (71) outputs a control signal to the air valve (42c) of the air pressure supplier (42), the air valve (42c) is switched to communicate the air tank (42b) with the air bag (41a) of the actuator (41) to supply the air pressure from the air tank (42b) to the air bag (41a). When the air bag (41a) is expanded by the air pressure, the rod (41b) is lifted upward to press the solar panel (20) upward. The pressing rotates the solar panel (20) until the detected angle coincides with the command angle (step ST7). Then, the flow returns from step ST7 to step ST1, and the execution flag is reset in step ST2 to finish the control.

(Reset Control)

The reset control will be described below. The reset control is performed when the angle (the detected angle) of the solar panel (20) is misaligned from the command angle due to the external force, e.g., the strong wind, in a period between the tracking controls.

When the angle (the detected angle) of the solar panel (20) deviates, it is determined in step ST1 that the detected angle is different from the command angle, and the flow proceeds to step ST3.

In step ST3, whether the execution flag is set or not is determined. The execution flag is not yet set immediately after the detected angle is determined to be different from the command angle in step ST1 (in the first loop). Thus, the flow proceeds to step ST4 to set the execution flag. Thereafter (in the second loop and subsequent loops), the flow proceeds to step ST5 because the execution flag has been set.

In step ST5, it is determined whether predetermined time or more (5 seconds or more in this example) has passed since the angle of the solar panels (20) was misaligned due to the external force (the strong wind) and the detected angle was determined to be different from the command angle. When the time passed does not exceed the predetermined time (not more than 5 seconds), the flow repeats steps ST1, ST3, and ST5 in this order. When the time passed is the predetermined time (5 seconds), the flow proceeds to step ST6. Thus, in step ST5, the solar panel is in a standby state for predetermined time (5 seconds) before operating the actuator (41) in step ST6.

Figure 4A:
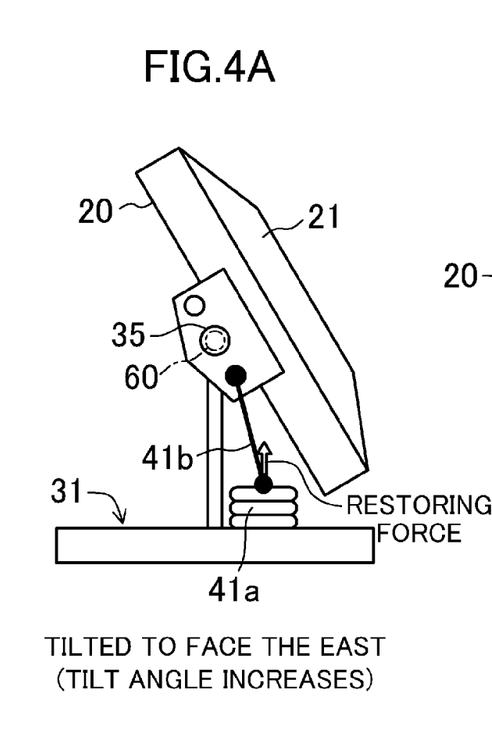
FIGS. 4A-4C are views showing a relationship between tilt of the solar panel and a restoring force generated by an air bag of the embodiment.
Figure 4B:
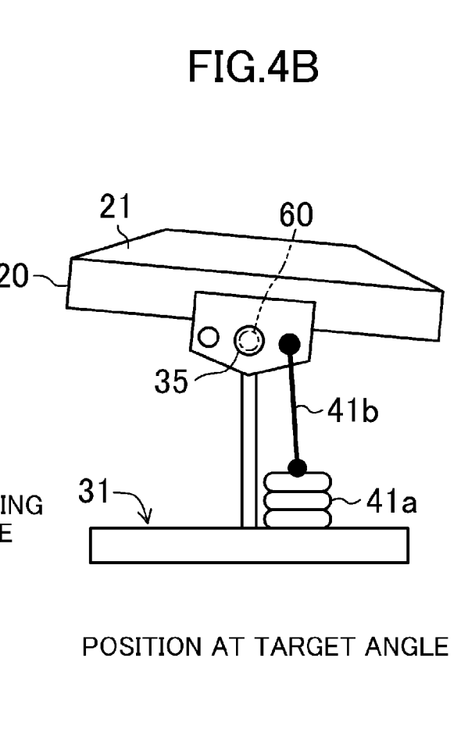
Figure 4C:
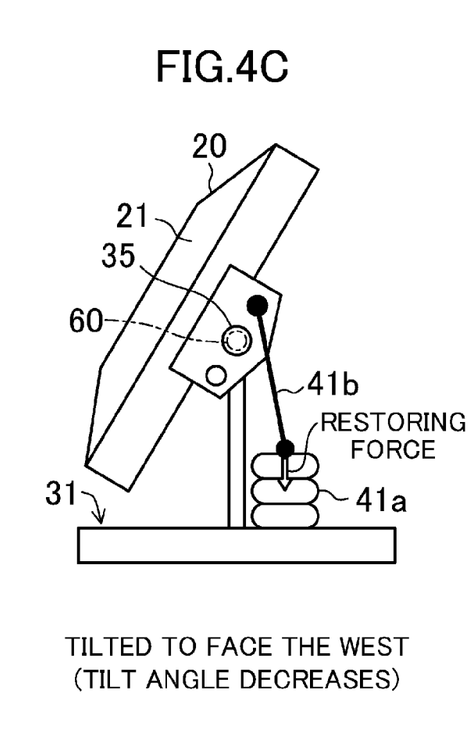
Figure 5:
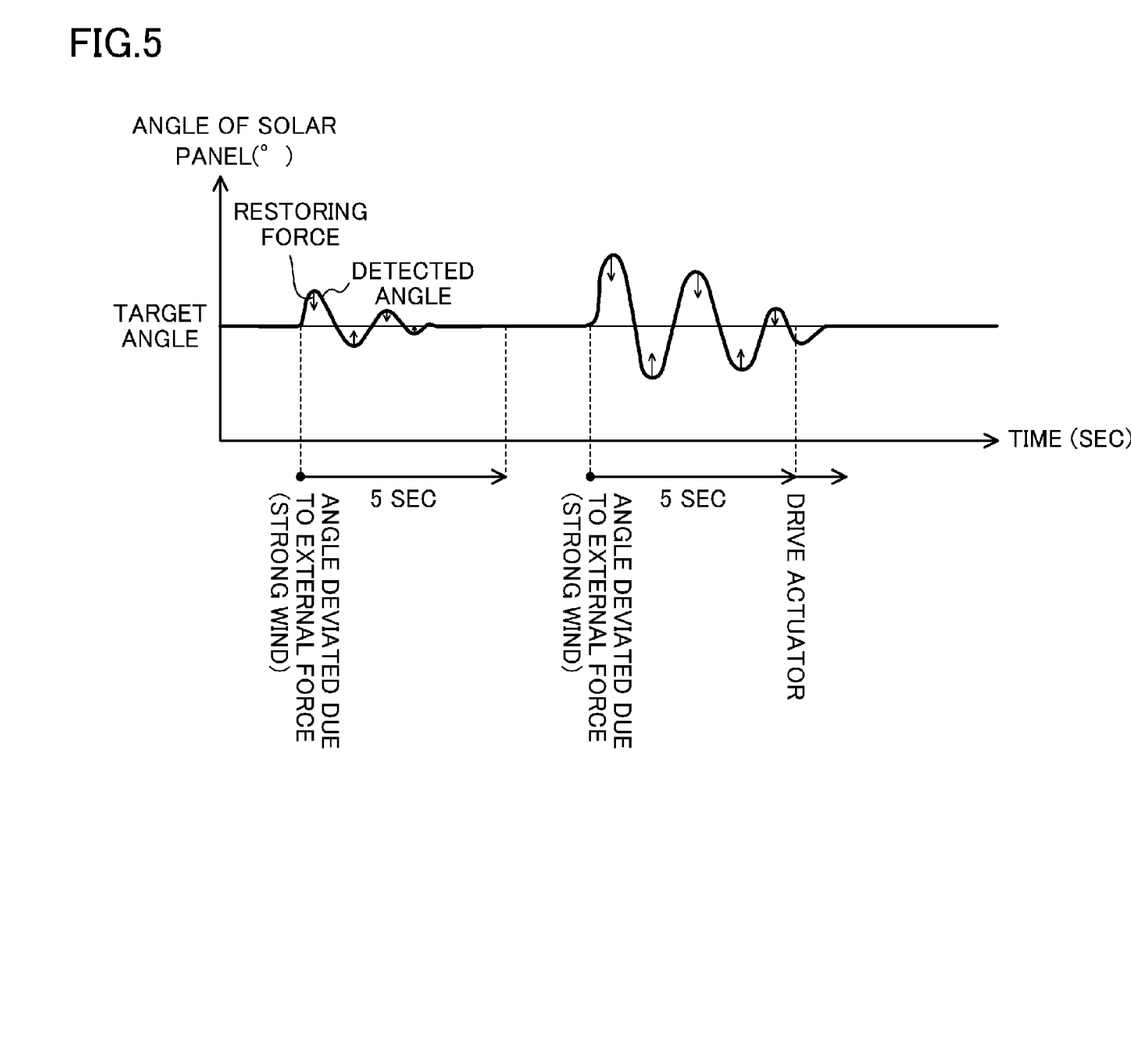
FIG. 5 is a graph showing a relationship between time and angle of the solar panel of the embodiment.

In the standby time (5 seconds), the air bag (41a) generates a restoring force, and the restoring force acts on the solar panel (20). Specifically, when the solar panel (20) is tilted to face the east (toward the direction in which the tilt angle increases) as shown in FIG. 4A from the position at the command angle (see FIG. 4B), the air bag (41a) shrinks to increase the air pressure in the air bag (41a). Thus, the air bag (41a) generates the restoring force in the direction of expansion of the air bag (41a), and the solar panel (20) is returned to the position at the command angle by the restoring force. Conversely, when the solar panel (20) is tilted to face the west (toward the direction in which the tilt angle decreases) as shown in FIG. 4C from the position at the command angle (see FIG. 4B), the air bag (41a) expands to reduce the air pressure in the air bag (41a). Thus, the air bag (41a) generates the restoring force in the direction of shrinkage of the air bag (41a), and the solar panel (20) is returned to the position at the command angle by the restoring force. As a result, as shown in FIG. 5, the solar panel (20) is tilted by the external force, and then vibrates for a while due to the restoring force around the position at the command angle. The vibration gradually decreases to approach the angle of the solar panel (20) to the command angle. When the solar panel (20) is completely returned to the position at the command angle in the standby time (5 seconds), it is determined in step ST1 that the detected angle is equal to the command angle, and the execution flag is reset in step ST2 to finish the control.

In step ST6, when the solar panel (20) did not return to the position at the command angle in the standby time (5 seconds), i.e., when the detected angle did not coincide with the command angle, the air pressure supplier (42) is actuated to actuate the actuator (41).

Specifically, when the detected angle is smaller than the command angle, the air valve (42c) is switched to communicate the air tank (42b) with the air bag (41a) to supply the air pressure from the air tank (42b) to the air bag (41a). When the air pressure is exerted on the air bag (41a) to expand the air bag (41a), the rod (41b) is lifted upward to press the solar panel (20) upward. The pressing rotates the solar panel (20) until the detected angle coincides with the command angle (step ST7). Then, the flow returns from step ST7 to step ST1, and the execution flag is reset in step ST2 to finish the control.

When the detected angle is larger than the command angle, the air valve (42c) is switched to communicate the air bag (41a) with the outside to discharge the air outside from the air bag (41a). Then, the solar panel (20) rotates while shrinking the air bag (41a) by its weight until the detected angle coincides with the command angle (step ST7). Then, the flow returns from step ST7 to step ST1, and the execution flag is reset in step ST2 to finish the control.

Advantages of Embodiment

According to the above-described embodiment, the reset control is performed to reset the angle of the solar panel (20) misaligned due to the strong wind. In the reset control, the actuator (41) is not operated until the predetermined time (5 seconds) has passed since the angle of the solar panel (20) was misaligned to wait for the strong wind to stop, and then the actuator (41) is operated after the lapse of the predetermined time (5 seconds) to reset the angle of the solar panel (20). In this way, the actuator (41) is not wastefully operated while the strong wind is blowing, and the operating time of the actuator (41) can be reduced as compared with the case where the electric motor is constantly operated while the strong wind is blowing. This can reduce the power consumption.

In the above-described embodiment, the pneumatic actuator is used as the actuator (41). Thus, the restoring force of the actuator (41) can reset the angle of the solar panel (20) until the predetermined time (5 seconds) has passed since the angle of the solar panel (20) was misaligned due to the strong wind. When the angle of the solar panel (20) is not completely reset in the predetermined time (5 seconds), the operation of the actuator (41) is started to continue the resetting of the angle of the solar panel. This can further reduce the operating time of the actuator (41), and can further reduce the power consumption.

According to the above-described embodiment, the relief valve (43) is provided in the supply passage (44) between the air valve (42c) and the air bag (41a). Thus, the abnormal increase in air pressure in the air bag (41a) can be reduced even when the solar panel (20) rotates in the direction of shrinkage of the air bag (41a) due to the strong wind. This can prevent break of the air bag (41a) and the air valve (42c) due to the air pressure in the air bag (41a) exceeded withstand pressures of the air bag (41a) and the air valve (42c).

Other Embodiments

Figure 6:
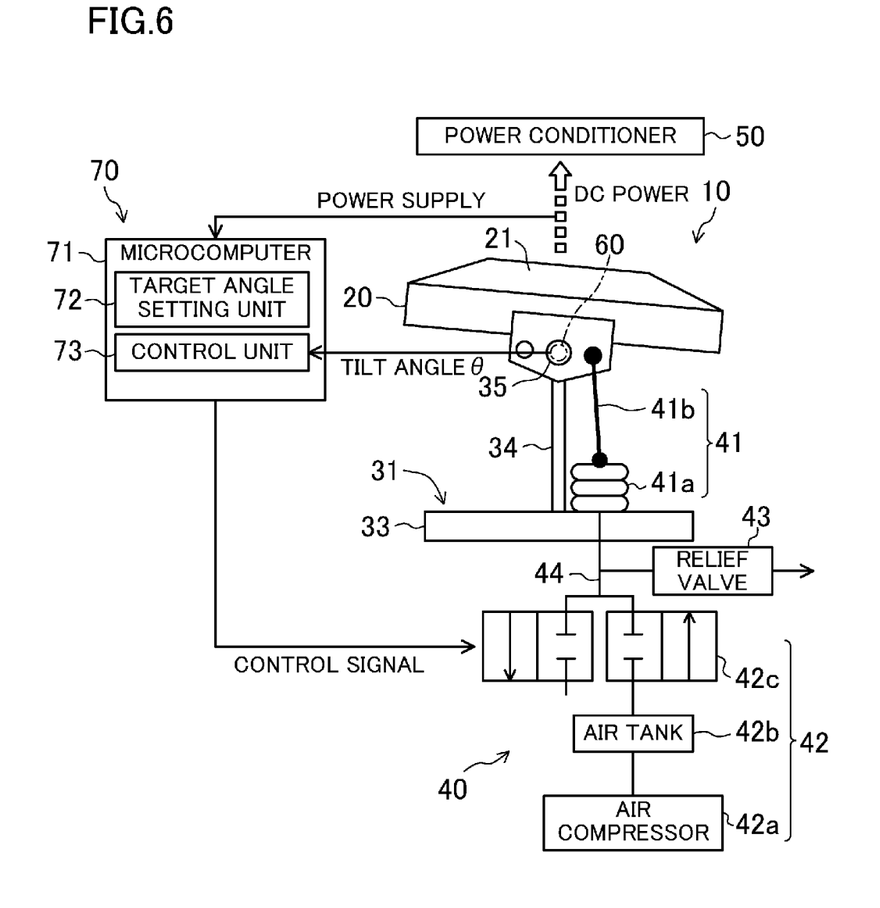
FIG. 6 is a general configuration diagram showing a driving cradle, a solar panel, an actuator unit, etc. of another embodiment.

In the above-described embodiment, a single three-way switching valve is used as the air valve (42c) of the air pressure supplier (42). The air valve (42c) may be constituted of two two-way switching valves as shown in FIG. 6, for example, as long as the switching between the state where the air is supplied from the air tank (42b) to the air bag (41a) and the state where the air is discharged outside from the air bag (41a) can be done.

Figure 7:
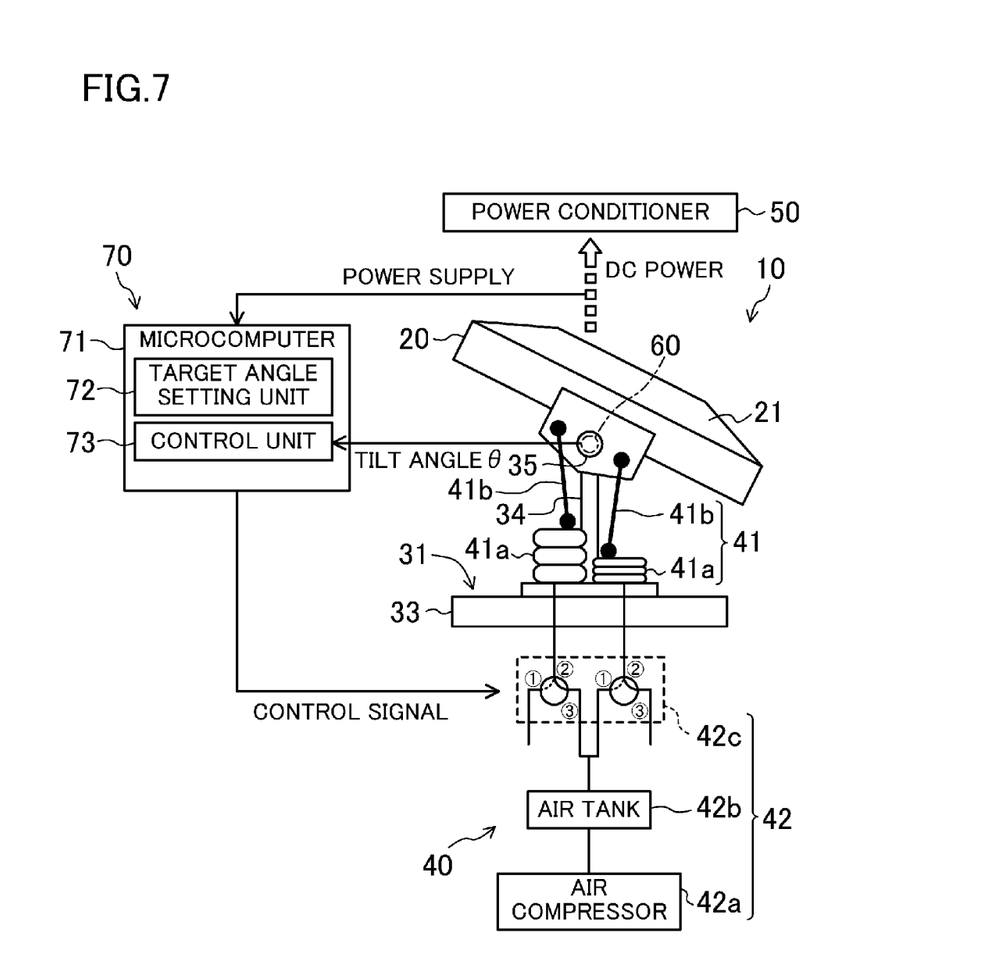
FIG. 7 is a general configuration diagram showing a driving cradle, a solar panel, an actuator unit, etc. of still another embodiment.

In the above-described embodiment, the single actuator (41) rotates the solar panel (20). However, the actuator (41) is not limited thereto, and two actuators (41) may be used to rotate the solar panel (20) as shown in FIG. 7, for example. In this case, the two actuators (41) are configured such that the air bag (41a) of one of the actuators (41) expands when the air bag (41a) of the other actuator (41) shrinks. The air valve (42c) is constituted of two switching valves each having three ports, and is configured to supply the air pressure from the air tank (42b) to one of the air bags (41a) to expand the one of the air bags (41a), while discharging the air outside from the other air bag (41a) to shrink the other air bag (41a), and vice versa.

In the above-described embodiment, the tracking control is performed based on the same control flow as the flow of the reset control (see FIG. 3). Specifically, in the tracking control, like in the reset control, the actuator (41) is operated after the predetermined time (5 seconds) has passed since the detected angle was determined to be different from the command angle. However, the control flow of the tracking control is not limited thereto, and for example, the actuator (41) may be operated immediately after the detected angle was determined to be different from the command angle. This improves properties of the solar panel (20) of tracking the movement of the sun.

In the reset control of the above-described embodiment, the operation of the actuator (41) is started after the predetermined time has passed since the detected angle was misaligned from the command angle. However, the reset control is not limited thereto, and for example, the operation of the actuator (41) may be started after the predetermined time has passed since the previous reset control was finished.

INDUSTRIAL APPLICABILITY

As described above, the present disclosure is useful for solar-tracking solar panel units.

DESCRIPTION OF REFERENCE CHARACTERS

10 Solar panel unit
20 Solar panel
41 Actuator
42 Air pressure supplier
43 Relief valve
44 Supply passage
60 Angle sensor (angle detector)
72 Target angle setting unit
73 Control unit

The invention claimed is:

1. A solar panel unit, comprising:
a rotatably supported solar panel;
an actuator which is connected to the solar panel to rotate the solar panel;
an angle detector which detects an angle of the solar panel; and
a control unit which operates the actuator such that the angle of the solar panel detected by the angle detector coincides with a command angle, wherein
the command angle is an angle of the solar panel determined in accordance with a direction of the sun,
the solar panel unit further comprises a command angle setting unit which sets the command angle every first predetermined time, and
the control unit performs tracking control by operating the actuator such that the detected angle coincides with the command angle every first predetermined time the command angle setting unit sets the command angle, and performs reset control by starting operation of the actuator after second predetermined time has passed since the detected angle was misaligned from the command angle due to external force in a period between the tracking controls to reset the angle of the solar panel.

2. The solar panel unit of claim 1, wherein
the actuator rotates the solar panel by air pressure.

3. The solar panel of claim 2, further comprising:
an air pressure supplier which supplies the air pressure to the actuator; and
a supply passage connecting the air pressure supplier and the actuator, wherein
a relief valve is provided in the supply passage to discharge air outside.

4. The solar panel unit of claim 1, wherein
the actuator includes an air bag which expands upon receiving air supplied by an air pressure supplier, and shrinks by discharging the supplied air outside, and a rod connected to the air bag and the solar panel and rotates the solar panel as the air bag expands and shrinks, the actuator being configured such that a restoring force is generated in the direction of expansion of the air bag when the solar panel is tilted by an external force in the direction of shrinkage of the air bag, and a restoring force is generated in the direction of shrinkage of the air bag when the solar panel is tilted by an external force in the direction of expansion of the air bag, and
the control unit is configured such that, during the reset control, the actuator is not operated until the second predetermined time passes since the detected angle of the solar panel is misaligned from the command angle by an external force in the tracking control, and then the actuator is operated when the second predetermined time passed to reset the angle of the solar panel if the solar panel is not returned to the position at the command angle by the restoring force of the air bag in the second predetermined time.

* * * * *